(12) United States Patent
Chen

(10) Patent No.: US 10,665,493 B1
(45) Date of Patent: May 26, 2020

(54) MICRO DEVICE ELECTROSTATIC CHUCK

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 23 days.

(21) Appl. No.: 16/181,365

(22) Filed: Nov. 6, 2018

(51) Int. Cl.
*H01L 21/683* (2006.01)

(52) U.S. Cl.
CPC ......... *H01L 21/6833* (2013.01); *Y10T 279/23* (2015.01)

(58) Field of Classification Search
CPC .................. H01L 21/6833; Y10T 279/23
See application file for complete search history.

(56) References Cited

U.S. PATENT DOCUMENTS

| | | | | |
|---|---|---|---|---|
| 5,350,479 A * | 9/1994 | Collins | ............... | H01L 21/6831 156/345.53 |
| 5,745,331 A * | 4/1998 | Shamouilian | ....... | H01L 21/6831 361/234 |
| 5,880,924 A * | 3/1999 | Kumar | ................ | H01L 21/6831 279/128 |
| 6,108,189 A * | 8/2000 | Weldon | ............... | C23C 16/4586 279/128 |
| 6,577,113 B2 * | 6/2003 | Sill | ........................ | H01J 37/321 324/72.5 |
| 7,072,166 B2 * | 7/2006 | Qin | ..................... | H01L 21/6833 361/234 |
| 7,375,046 B2 * | 5/2008 | Aihara | ................... | C04B 35/505 264/614 |
| 7,646,581 B2 * | 1/2010 | Sasaki | ................... | C23C 14/505 361/234 |
| 7,667,944 B2 * | 2/2010 | Naim | ................ | H01L 21/67109 361/230 |
| 7,714,406 B2 * | 5/2010 | LaFontaine | ............ | H02N 13/00 257/499 |
| 8,228,658 B2 * | 7/2012 | Purohit | ................... | H02N 13/00 361/234 |
| 8,619,406 B2 * | 12/2013 | Cho | ..................... | H01L 21/6833 361/234 |
| 9,378,862 B2 * | 6/2016 | Ootomo | ................... | H01B 3/12 |
| 9,508,561 B2 * | 11/2016 | Naik | ................. | H01L 21/32136 |
| 9,944,561 B2 * | 4/2018 | Ishizuka | ................ | H01B 3/004 |
| 2004/0192053 A1 * | 9/2004 | Fujimoto | .......... | H01L 21/31116 438/697 |
| 2006/0075967 A1 * | 4/2006 | Lu | ......................... | C23C 16/045 118/723 I |
| 2007/0224451 A1 * | 9/2007 | Chandran | ............... | C04B 35/16 428/698 |

(Continued)

*Primary Examiner* — Eric A. Gates
(74) *Attorney, Agent, or Firm* — CKC & Partners Co., LLC

(57) ABSTRACT

An electrostatic chuck including a body, an electrode, at least one dielectric layer, and a composite dielectric layer is provided. The electrode is present on the body. The dielectric layer is present on and covers the electrode. The composite dielectric layer is present on the dielectric layer. The composite dielectric layer includes a polymer layer and a plurality of inorganic dielectric particles. The inorganic dielectric particles are distributed within the polymer layer, and a permittivity of the inorganic dielectric particles is greater than a permittivity of the polymer layer. A resistivity of the dielectric layer is greater than a resistivity of the composite dielectric layer.

10 Claims, 3 Drawing Sheets

(56) References Cited

U.S. PATENT DOCUMENTS

| 2017/0057875 | A1* | 3/2017 | Ishizuka | H01B 3/004 |
| 2019/0043746 | A1* | 2/2019 | Yoshioka | C04B 35/6261 |
| 2020/0027726 | A1* | 1/2020 | Venkatasubramanian | H01L 21/02186 |

* cited by examiner

MICRO DEVICE ELECTROSTATIC CHUCK

BACKGROUND

Field of Invention

The present disclosure relates to an electrostatic chuck for picking up a micro device through an electrostatic pressure.

Description of Related Art

The statements in this section merely provide background information related to the present disclosure and do not necessarily constitute prior art.

In recent years, micro devices have become popular in various applications. Among all technical aspects of micro devices, transfer process is one of the most challenging tasks for micro devices to be commercialized. One of the important issues of the transfer process is the design of electrostatic chucks.

SUMMARY

According to some embodiments of the present disclosure, an electrostatic chuck including a body, an electrode, at least one dielectric layer, and a composite dielectric layer is provided. The electrode is present on the body. The dielectric layer is present on and covers the electrode. The composite dielectric layer is present on the dielectric layer. The composite dielectric layer includes a polymer layer and a plurality of inorganic dielectric particles. The inorganic dielectric particles are distributed within the polymer layer, and a permittivity of the inorganic dielectric particles is greater than a permittivity of the polymer layer. A resistivity of the dielectric layer is greater than a resistivity of the composite dielectric layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
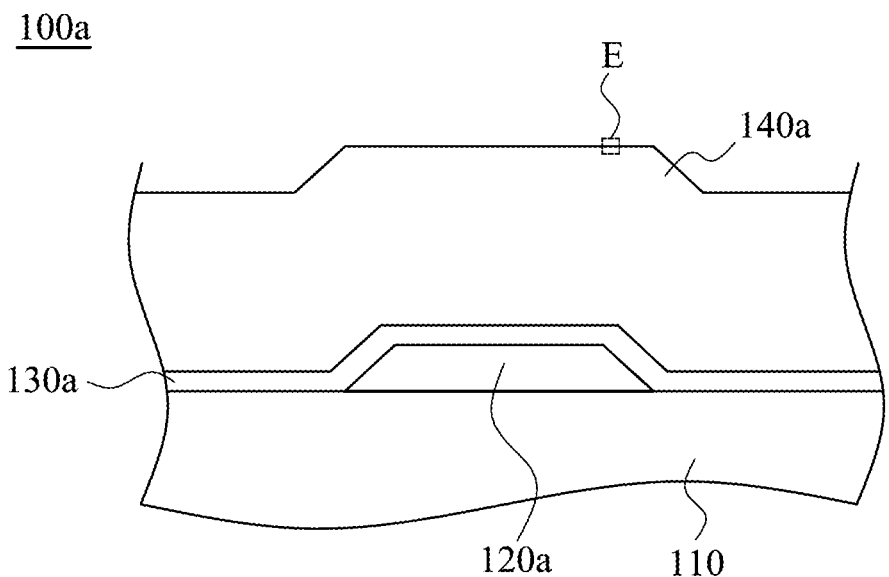
FIG. 1A is a cross-sectional view of an electrostatic chuck according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1B:
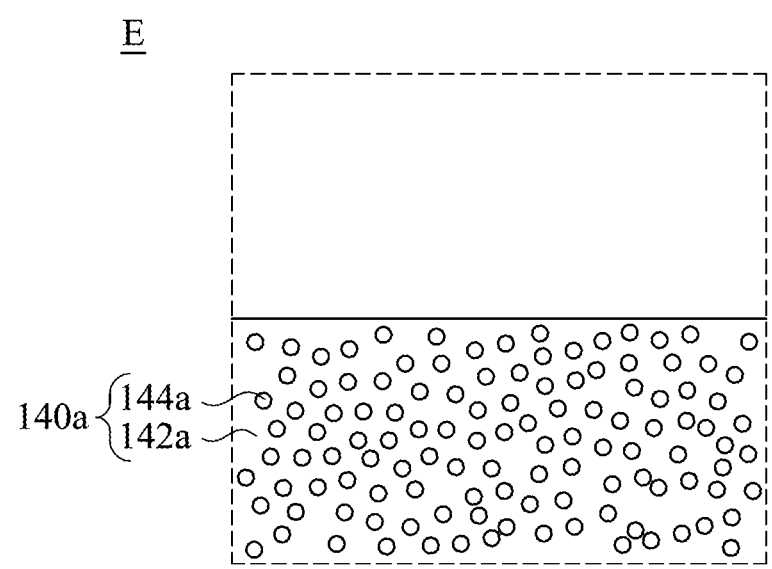
FIG. 1B is an enlarged cross-sectional view of a portion of a composite dielectric layer according to some embodiments of the present disclosure.

References are made to FIGS. 1A and 1B. FIG. 1A is a cross-sectional view of an electrostatic chuck 100a according to some embodiments of the present disclosure. FIG. 1B is an enlarged cross-sectional view of a portion of a composite dielectric layer 140a according to some embodiments of the present disclosure. In some embodiments, an electrostatic chuck 100a including a body 110, an electrode 120a, a dielectric layer 130a, and a composite dielectric layer 140a is provided. Although most of terms described in the following disclosure use singular nouns, said terms may also be plural in accordance with figures or practical applications.

The electrode 120a is present on the body 110. The body 110 may include a variety of materials such as silicon, ceramic, glass, or quartz, which are capable of providing structural support. The dielectric layer 130a is present on and covers the electrode 120a. The composite dielectric layer 140a is present on the dielectric layer 130a. In some embodiments, the dielectric layer 130a can be formed by atomic layer deposition (ALD), thermal deposition, sputtering, chemical vapor deposition (CVD), or physical vapor deposition (PVD). The composite dielectric layer 140a includes a polymer layer 142a and a plurality of inorganic dielectric particles 144a, as shown in FIG. 1B which is an enlarged view of the portion E in FIG. 1A. The inorganic dielectric particles 144a are distributed within the polymer layer 142a. Specifically, the polymer layer 142a can be a polymer matrix which can be made by crosslinking polymers, and the inorganic dielectric particles 144a are embedded in the polymer matrix. The volume ratio of the polymer layer 142a and the inorganic dielectric particles 144a of the composite dielectric layer 140a shown FIG. 1B is only schematic. The polymer layer 142a can be polymethyl methacrylate (PMMA), polydimethylsiloxane (PDMS), or epoxy, but should not be limited thereto. The inorganic dielectric particles 144a can include titanium dioxide ($TiO_2$), barium titanate ($BaTiO_3$), zirconium dioxide ($ZrO_2$), or combinations thereof. In some embodiments, the composite dielectric layer 140a is made by first mixing the inorganic dielectric particles 144a into the polymer layer 142a, and then using a process such as spin-coating, slit-coating, or inkjet printing to form the composite dielectric layer 140a on the dielectric layer 130a.

In some embodiments, each of the inorganic dielectric particles 144a is coated with a metal thereon, and is wrapped by said metal, so as to enhance dipole moments of each of the inorganic dielectric particles 144a, and hence the electrostatic pressure exerted by the electrostatic chuck 100a to the micro device to be picked up can be further enhanced. In some embodiments, an average diameter of the inorganic dielectric particles 144a is smaller than a size of a micro device to be picked up by the electrostatic chuck 100a, such as equal to or smaller than 100 nanometers, so as to provide a substantially uniform electrostatic pressure to said micro device.

In some embodiments, a thickness of the composite dielectric layer 140a is greater than a thickness of the dielectric layer 130a, so as to increase a breakdown voltage of the electrostatic chuck 100a. Besides, the thicker composite dielectric layer 140a can be less sensitive to an air gap between the composited dielectric layer 140a and the micro device to be picked up when the applied voltage increases. Furthermore, the thicker dielectric layer 140a can prevent the dielectric layer 130a from scratching. In some embodiments, a thickness of the composite dielectric layer 140a ranges from about 0.2 μm to about 100 μm. In some embodiments, a thickness of the composite dielectric layer 140a ranges from about 1 μm to about 10 μm.

In some embodiments, a permittivity of the inorganic dielectric particles 144a is greater than a permittivity of the polymer layer 142a, such that an equivalent permittivity of the composite dielectric layer 140a can be enhanced compared to a permittivity of the composite dielectric layer 140a without the inorganic dielectric particles 144a (i.e., compared to the case with only the polymer layer 142a constituting the composite dielectric layer 140a). In some embodiments, a material of the polymer layer 142a has a permittivity about 1.4 to 1.5 times the vacuum permittivity (i.e., a dielectric constant of the polymer layer 142a is about 1.4 to 1.5). In some embodiments, a material of the inorganic dielectric particles 144a has a permittivity more than two decades of the vacuum permittivity (i.e., a dielectric constant of the inorganic dielectric particles 144a is more than 20). In some embodiments, an equivalent permittivity of the composite dielectric layer 140a is greater than 6 times of the vacuum permittivity by tuning a ratio of the total volume of the polymer layer 142a to the total volume of the inorganic dielectric particles 144a. As such, the composite dielectric layer 140a not only can prevent the electrostatic chuck 100a from scratches when picking up a micro device due to its pliable surface formed by the polymer layer 142a (i.e., a hardness of the dielectric layer 130a is greater than a hardness of the composite dielectric layer 140a), but also have a sufficiently high permittivity to exert an electrostatic pressure which is high enough to stably transfer a micro device.

In some embodiments, a resistivity of the dielectric layer 130a is greater than a resistivity of the composite dielectric layer 140a, so as to prevent a possible current leakage from the electrode 120a to a contact surface between the composite dielectric layer 140a and the micro device to be picked up.

In some embodiments, the dielectric layer 130a includes teflon, epoxy, or combinations thereof. In some embodiments, the dielectric layer 130a includes an inorganic material, such as silicon nitride ($SiN_x$), hafnium oxide ($HfO_2$), silicon dioxide ($SiO_2$), or combinations thereof.

With the above configuration, a combination of the dielectric layer 130a and the composite dielectric layer 140a can have several benefits. First, since the polymer layer 142a of the composite dielectric layer 140a is generally pliable (e.g., PMMA) compared to a micro device to be picked up, the polymer layer 142a can prevent the electrostatic chuck 100a from scratches, thus preventing failure of picking up. The polymer layer 142a also reveals better contact with the micro device to be picked up. However, soft materials often have lower permittivities, and thus an electrostatic pressure exerted by the electrostatic chuck with a soft material thereon (e.g. said polymer layer 142a) to the micro device is also lower compared to dielectric materials having greater hardness (e.g., silicon nitride). In order to enhance the electrostatic pressure while keeping a pliable contact between the electrostatic chuck 100a and the micro device, the inorganic dielectric particles 144a having a higher permittivity compared to the polymer layer 142a are introduced and mixed in the polymer layer 142a to enhance the equivalent permittivity of the composite dielectric layer 140a. However, the introduction of the inorganic dielectric particles 144a tends to increase the occurrence of local charge accumulations, such charge accumulations may cause the inorganic dielectric particles 144a to form channels and cause current leakages. Therefore, the dielectric layer 130a with a higher resistivity compared to the composite dielectric layer 140a is present to solve the current leakage phenomenon of the channels formed by the inorganic dielectric particles 144a.

Figure 2:
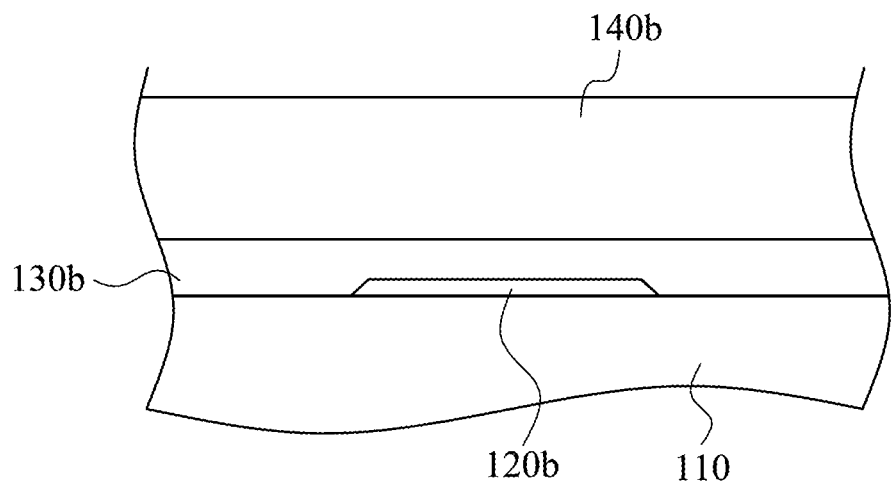
FIG. 2 is a cross-sectional view of an electrostatic chuck according to some embodiments of the present disclosure.

Reference is made to FIG. 2. FIG. 2 is a cross-sectional view of an electrostatic chuck 100b according to some embodiments of the present disclosure. Differences between the electrostatic chuck 100b and the electrostatic chuck 100a are that, the dielectric layer 130b has a substantially flat surface facing away from the electrode 120b as shown in FIG. 2, while a surface of the dielectric layer 130a facing away from the electrode 120a has a raised platform above the electrode 120a as shown in FIG. 1A. Similarly, the composite dielectric layer 140b has a substantially flat surface facing away from the electrode 120b, while a surface of the composite dielectric layer 140a facing away from the electrode 120a has a raised platform above the electrode 120a. The above differences may come from different thicknesses between the electrode 120a and the electrode 120b, but should not be limited thereto.

Figure 3:
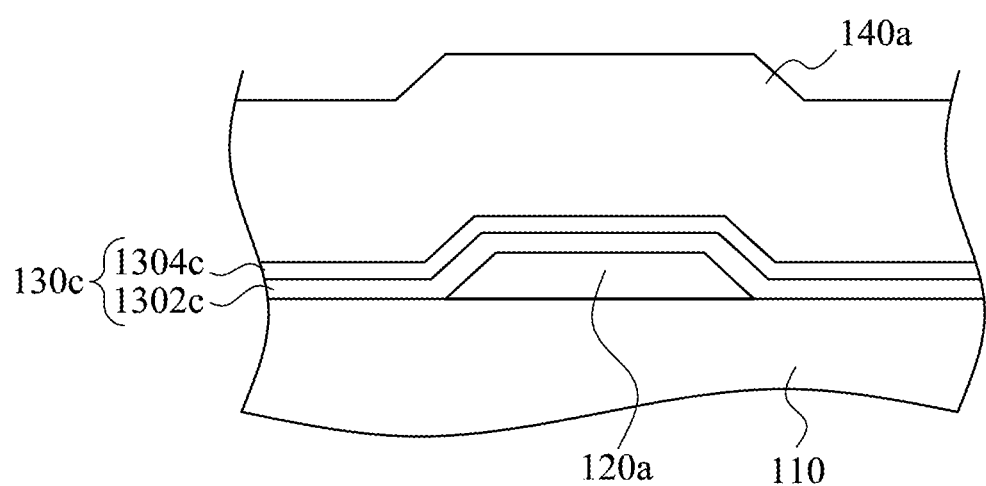
FIG. 3 is a cross-sectional view of an electrostatic chuck according to some embodiments of the present disclosure.

Reference is made to FIG. 3. FIG. 3 is a cross-sectional view of an electrostatic chuck 100c according to some embodiments of the present disclosure. In some embodiments, a number of the dielectric layer 130c is plural. For example, in FIG. 3 the dielectric layer 130c includes a first dielectric layer 1302c and a second dielectric layer 1304c. The first dielectric layer 1302c is present on and in contact with the electrode 120a. The second dielectric layer 1304c is present and stacked on the first dielectric layer 1302c. The first and second dielectric layers 1302c, 1304c may include two of the materials selected from silicon nitride ($SiN_x$), dioxohafnium ($HfO_2$), Silicon dioxide ($SiO_2$), tantalum pentoxide ($Ta_2O_5$), titanium dioxide ($TiO_2$), zirconium dioxide ($ZrO_2$), aluminium oxide ($Al_2O_3$), teflon, and epoxy respectively, but should not be limited thereto. Although in FIG. 3 the dielectric layer 130c has a raised platform, in some other embodiments, such as embodiments with thinner electrode 120a (e.g., replacing the electrode 120a with the electrode 120b, similar to the embodiments illustrated by FIG. 2), the dielectric layer 130c can also have a substantially flat surface facing away from the electrode 120a (or 120b).

Figure 4:
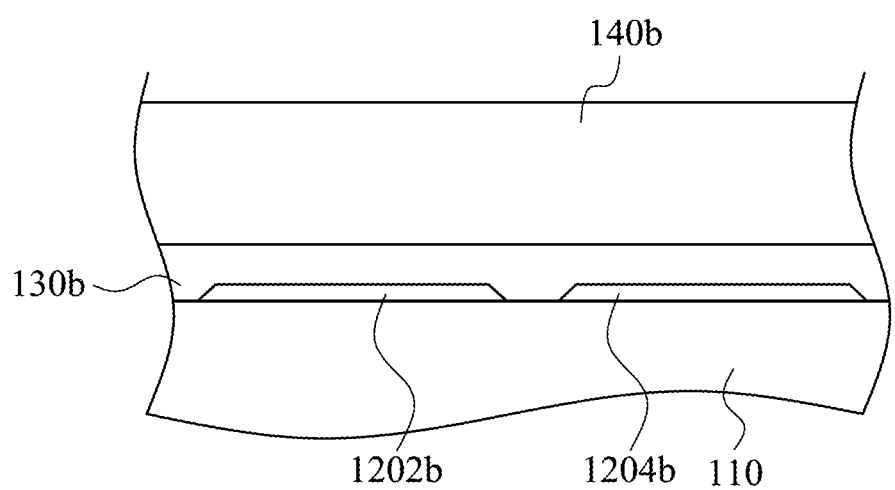
FIG. 4 is a cross-sectional view of an electrostatic chuck according to some embodiments of the present disclosure.

Reference is made to FIG. 4. FIG. 4 is a cross-sectional view of an electrostatic chuck 100d according to some embodiments of the present disclosure. In some embodiments, the electrostatic chuck 100d can include two electrodes (e.g., a first electrode 1202b and a second electrode 1204b) present between the dielectric layer 130b and the body 110. The second electrode 1204b is adjacent to and electrically isolated from the electrode 1202b. In some embodiments, the electrodes 1202b and 1204b can be bipolar electrodes. That is, different voltages are respectively applied to the electrodes 1202b and 1204b for picking up the micro device. In some embodiments, voltages applied to the electrodes 1202b and 1204b can be a positive voltage and a negative voltage respectively to enhance and stabilize the electrostatic pressure for picking up the micro device. Besides, the bipolar electrodes can have two-phase and multi-phase when alternating currents is applied to the electrodes 1202b and 1204b. Specifically, bipolar electrodes are more capable of picking up an insulator or an ungrounded object (or an electrostatically floated object).

In summary, embodiments of the present disclosure provide an electrostatic chuck for picking up a micro device through an electrostatic pressure. A dielectric layer with high resistivity is present between a composite dielectric layer with low resistivity and an electrode. As such, when a transferring process is conducted, a current leakage caused by charge accumulations of the electrostatic chuck can be prevented, while an electrostatic pressure can be stable and kept high enough.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electrostatic chuck, comprising:
  a body;
  an electrode present on the body;
  at least one dielectric layer present on and covering the electrode; and
  a composite dielectric layer present on the at least one dielectric layer, comprising:
    a polymer layer; and
    a plurality of inorganic dielectric particles distributed within the polymer layer, a permittivity of the inorganic dielectric particles being greater than a permittivity of the polymer layer,
  wherein a resistivity of the at least one dielectric layer is greater than a resistivity of the composite dielectric layer.

2. The electrostatic chuck of claim 1, wherein a hardness of the at least one dielectric layer is greater than a hardness of the composite dielectric layer.

3. The electrostatic chuck of claim 1, wherein the at least one dielectric layer comprises an inorganic material.

4. The electrostatic chuck of claim 1, wherein the at least one dielectric layer comprises silicon nitride ($SiN_x$), dioxohafnium ($HfO_2$), silicon dioxide ($SiO_2$), or combinations thereof.

5. The electrostatic chuck of claim 1, wherein the at least dielectric layer comprises teflon, epoxy, or combinations thereof.

6. The electrostatic chuck of claim 1, wherein a number of the at least one dielectric layer is plural.

7. The electrostatic chuck of claim 1, wherein the inorganic dielectric particles comprise titanium dioxide ($TiO_2$) or barium titanate ($BaTiO_3$).

8. The electrostatic chuck of claim 1, wherein each of the inorganic dielectric particles is coated with a metal thereon, and is wrapped by the metal.

9. The electrostatic chuck of claim 1, wherein a thickness of the composite dielectric layer is greater than a thickness of the at least one dielectric layer.

10. The electrostatic chuck of claim 1, further comprising a second electrode present between the at least one dielectric layer and the body, wherein the second electrode is adjacent to and electrically isolated from the electrode.

* * * * *